United States Patent
Smith et al.

(10) Patent No.: US 10,634,294 B1
(45) Date of Patent: Apr. 28, 2020

(54) METHOD OF MAKING A WAVELENGTH SPECIFIC LIGHT SOURCE

(71) Applicant: OPē, LLC, Theodore, AL (US)

(72) Inventors: Joshua Norman Smith, Mobile, AL (US); Robert Chad McCollum, Mobile, AL (US); Richard Earl Preston, Mobile, AL (US)

(73) Assignee: OPē, LLC, Theodore, AL (US)

( * ) Notice: Subject to any disclaimer, the term of this patent is extended or adjusted under 35 U.S.C. 154(b) by 0 days.

(21) Appl. No.: 16/665,032

(22) Filed: Oct. 28, 2019

Related U.S. Application Data

(62) Division of application No. 14/994,859, filed on Jan. 13, 2016, now Pat. No. 10,465,861.

(51) Int. Cl.
| | |
|---|---|
| *F21K 9/64* | (2016.01) |
| *H01L 33/60* | (2010.01) |
| *F21K 9/62* | (2016.01) |
| *C23C 16/06* | (2006.01) |
| *C23C 16/455* | (2006.01) |
| *B05D 1/00* | (2006.01) |
| *F21V 9/30* | (2018.01) |
| *F21Y 113/13* | (2016.01) |

(52) U.S. Cl.
CPC ............... *F21K 9/64* (2016.08); *B05D 1/005* (2013.01); *C23C 16/06* (2013.01); *C23C 16/45525* (2013.01); *F21K 9/62* (2016.08); *F21V 9/30* (2018.02); *H01L 33/60* (2013.01); *F21Y 2113/13* (2016.08)

(58) Field of Classification Search
CPC .... H01L 33/50–508; H01L 33/60; F21K 9/64
USPC .................................... 313/502, 503, 512
See application file for complete search history.

(56) References Cited

U.S. PATENT DOCUMENTS

| | | | |
|---|---|---|---|
| 5,136,483 A | 8/1992 | Schoniger et al. | |
| 6,478,450 B1* | 11/2002 | Grajcar ............... | F21V 19/04 362/231 |
| 7,891,840 B1 | 2/2011 | Kang et al. | |
| 2010/0110728 A1 | 5/2010 | Dubrow et al. | |
| 2010/0259917 A1 | 10/2010 | Ramer et al. | |
| 2010/0321919 A1 | 12/2010 | Yang | |
| 2011/0063835 A1 | 3/2011 | Rivas et al. | |
| 2011/0096570 A1 | 4/2011 | Vissenberg et al. | |
| 2012/0287626 A1 | 11/2012 | Kang et al. | |
| 2014/0355251 A1* | 12/2014 | Kahrs ............. | F21V 33/0052 362/97.1 |

(Continued)

*Primary Examiner* — Anh T Mai
*Assistant Examiner* — Michael Chiang
(74) *Attorney, Agent, or Firm* — Aslan Law, P.C.

(57) ABSTRACT

A light source is realized in a wall portion and a base portion forming a flexible structure, the wall portion having a plurality of inward facing LEDs, a bottom edge of the wall portion being adjacent to an edge of the wide portion. The resulting well is subsequently filled with a material to form an optical cavity, the height of the resultant optical cavity being matching a top edge of the wall portion. The top surface of the optical cavity is spin coated with a thin layer of quantum dots which serve to shift a wavelength of light emitted from the LEDs. Finally, a protective layer is applied to fix and protect the thin layer of quantum dots. Thus, a light source is realized which can reliably provide light at a specific wavelength defined by the interaction between the LEDs and quantum dots.

11 Claims, 8 Drawing Sheets

(56) References Cited

U.S. PATENT DOCUMENTS

| | | |
|---|---|---|
| 2015/0009649 A1* | 1/2015 | Jagt ........................ H01L 33/507 362/84 |
| 2015/0077985 A1* | 3/2015 | Wang ........................ F21S 4/28 362/231 |
| 2015/0151673 A1 | 6/2015 | Salter et al. |
| 2016/0195669 A1 | 7/2016 | Boulanger et al. |
| 2016/0218252 A1 | 7/2016 | Steckel et al. |
| 2017/0160431 A1 | 6/2017 | You et al. |
| 2017/0192304 A1 | 7/2017 | Matsuura |
| 2018/0283652 A1 | 10/2018 | Lee et al. |

\* cited by examiner

FIG. 6A1  FIG. 6A2

METHOD OF MAKING A WAVELENGTH SPECIFIC LIGHT SOURCE

CROSS-REFERENCE TO RELATED APPLICATIONS

This application is a Divisional of U.S. patent application Ser. No. 14/994,859 filed on Jan. 13, 2016, to be issued as U.S. Pat. No. 10,465,861 on Nov. 5, 2019, the contents of which are incorporated herein, by this reference, in their entirety.

FIELD

The instant application relates to making a light source that produces light at a specific wavelength based on an interaction between its component elements.

SUMMARY

The following embodiments describe a light source and method of creating the same which is capable of reliably producing light at specific wavelengths. Certain embodiments are described in concrete form, but it will be appreciated that materials and configurations different than those mentioned with regard to the embodiments can be utilized as the situation requires.

BRIEF DESCRIPTION OF THE DRAWINGS

FIG. 6A1 shows a configuration of a structure used in a fabrication process of the light source.

FIG. 6A2 shows a top side configuration of a structure used in a fabrication process of the light source according to an embodiment.

DETAILED DESCRIPTION

A light source is realized through a ring or other shape (referred to generically hereinafter, for simplicity and not by way of limitation, as a ring) formed from a flexible structure upon which a plurality of inward-facing LEDs are printed, a bottom edge of the ring being adjacent to a base portion. A well, formed by placement of the ring adjacent to the base portion, is subsequently filled with a clear filler such as plastic (e.g., polydimethylsiloxane (PDMS) or poly(methyl methacrylate) (PMMA)), the height of the resultant optical cavity thereby generally matching a top edge of the ring. The top surface of the optical cavity is then spin-coated with a layer of quantum dots which serve to alter a wavelength of light emitted from the LEDs via the optical cavity. Finally, a protective layer (e.g., aluminum oxide (AlO)) is applied to the light source to set and protect the layer of quantum dots. The quantum dot layer can then serve to shift a wavelength of light produced by the LEDs to a different wavelength. The wavelength to which the light produced by the LEDs is shifted is defined by the properties of the quantum dots. Thus, a light source is realized which can reliably provide light at a wavelength defined by the interaction between the light from the LEDs and the quantum dots.

Figure 1:
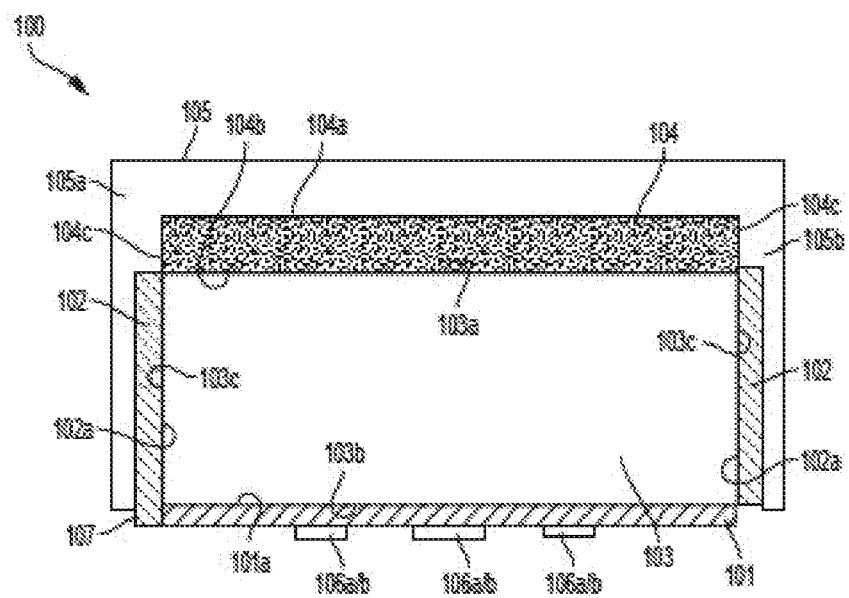
FIG. 1 shows a cross-sectional view of an embodiment of the light source along line I in FIG. 2.

FIG. 1 shows a cross-sectional view of light source 100 comprising base portion 101, LED ring 102, optical cavity 103, quantum dot layer 104, and protective layer 105.

Figure 2:
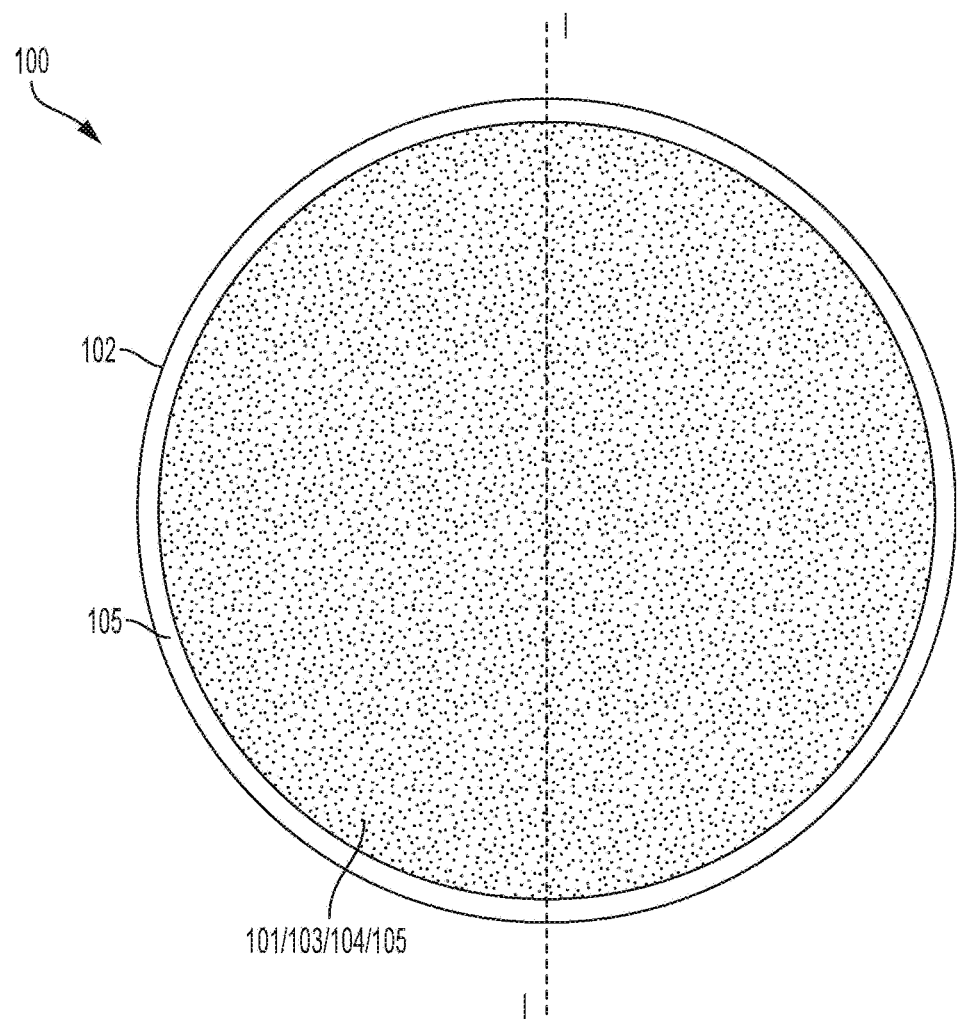
FIG. 2 shows a top-down view of a first embodiment of the light source.

FIG. 2 shows the light source from above. Base portion 101, optical cavity 103, quantum dot layer 104, and protective layer 105 are layered on top of one another with protective layer 105 being the topmost layer and base portion 101 being the bottommost later.

Base portion 101 is formed in a substantially circular shape. A disc-shaped base portion 101 is used, but other embodiments include different shapes. LED ring 102 is formed of a flexible material, e.g., polyester, such that electrically connected LEDs are disposed by, e.g., printing or "pick and place" along the inward facing surface 102a of LED ring 102. Inward facing surface 102a of LED ring 102 is reflective. Further, in an exemplary embodiment, base portion 101 is formed of the same material as LED ring 102. In an exemplary embodiment base portion 101 is connected to LED ring 102 by connecting portion 107. An embodiment of a connecting portion 107 is shown in, e.g. FIG. 6A1 at reference number 603. Input/output terminals 106a and 106b are disposed on base portion 101, in order to connect LED ring 102 to power (not shown). In alternative embodiments, input/output terminals 106a and 106b are disposed on connecting portion 107 or LED ring 102.

Figure 3:
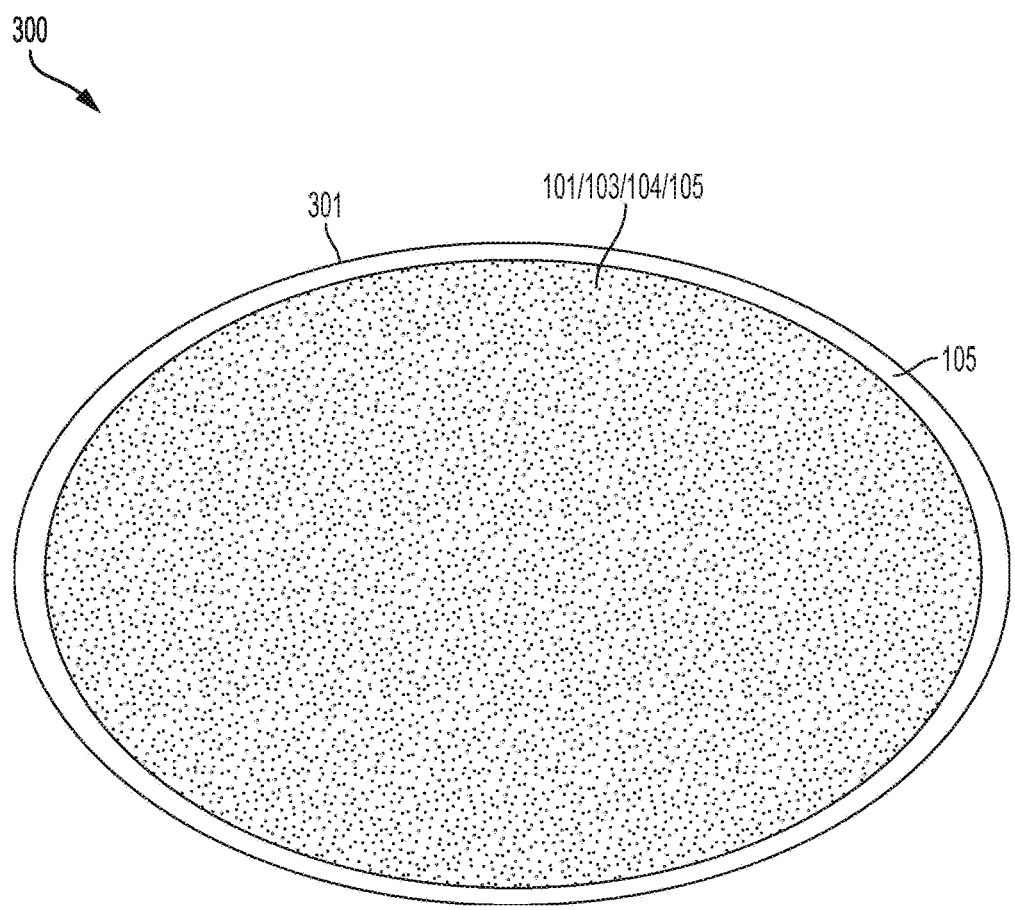
FIG. 3 shows a top-down view of a second embodiment of the light source.
Figure 4:
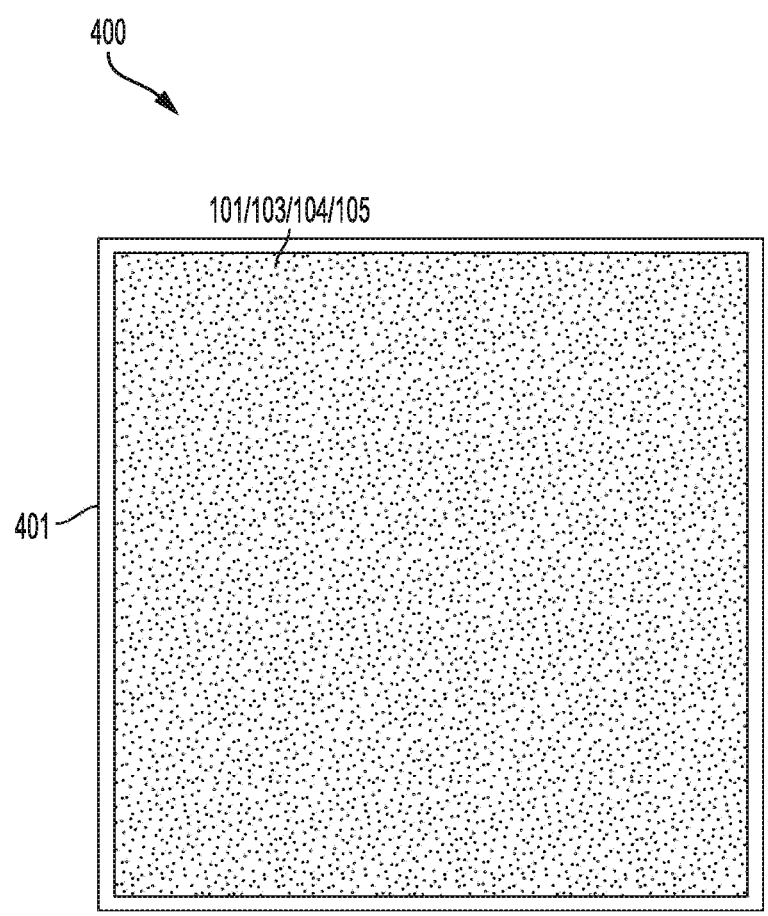
FIG. 4 shows a top-down view of a third embodiment of the light source.

In an alternative embodiment, the aforementioned structure of flexible material forms an LED oval 301 of light source 300 (FIG. 3) rather than LED ring 102. In a further alternative embodiment, the structure of flexible material forms a LED square 401 of light source 400 (FIG. 4) in place of LED ring 102. Yet further embodiments include arbitrarily shaped flexible materials in place of LED oval 301.

Printing of LEDs may be performed by the approach described in U.S. Patent Publication US20140264396 A1 to Nthdegree Technologies Worldwide Inc. (please refer to pages 5 through 8 of the specification thereof for a helpful description of LED printing, which is incorporated herein by this specific reference). In an embodiment, the LEDs are printed such that they produce light within a predetermined tolerance range of wavelengths.

Optical cavity 103 is disposed within the well formed by base portion 101 and LED ring 102. Top surface 101a is in contact with bottom surface 103b. Thereby, photons can be emitted by the LEDs of LED ring 102, and are reflected by base portion 101 and LED ring 102 so as to be emitted from top surface 103a.

Top surface 103a is in contact with side 104a of quantum dot layer 104. Quantum dot layer 104 serves to shift the wavelength of light transmitted there through in order to ensure a uniform wavelength is produced by light source 100. The wavelength can be predetermined by defining the properties of the quantum dots in quantum dot layer 104.

To prevent shifting and decay due to the nature of quantum dot layer 104, and to fix quantum dot layer 104 to optical cavity 103, protective layer 105 covers quantum dot layer 104 on all sides except for the side of the quantum dot layer 104a which is in contact with optical cavity 103. Protective layer 105 is composed of a transparent material such as transparent Aluminum Oxide (A10). In an embodiment, protective layer 105 is formed by way of atomic layer deposition (ALD). Further, shoulder 105a and shoulder 105b extend down to cover sides 104b and 104c, and additionally substantially cover LED ring 102, thereby providing more robust protection against shifting and decay of quantum dot layer 104, and additionally providing additional protection and stability to light source 100. In another embodiment, shoulders 105a and 105b are opaque rather than transparent.

Figure 5:
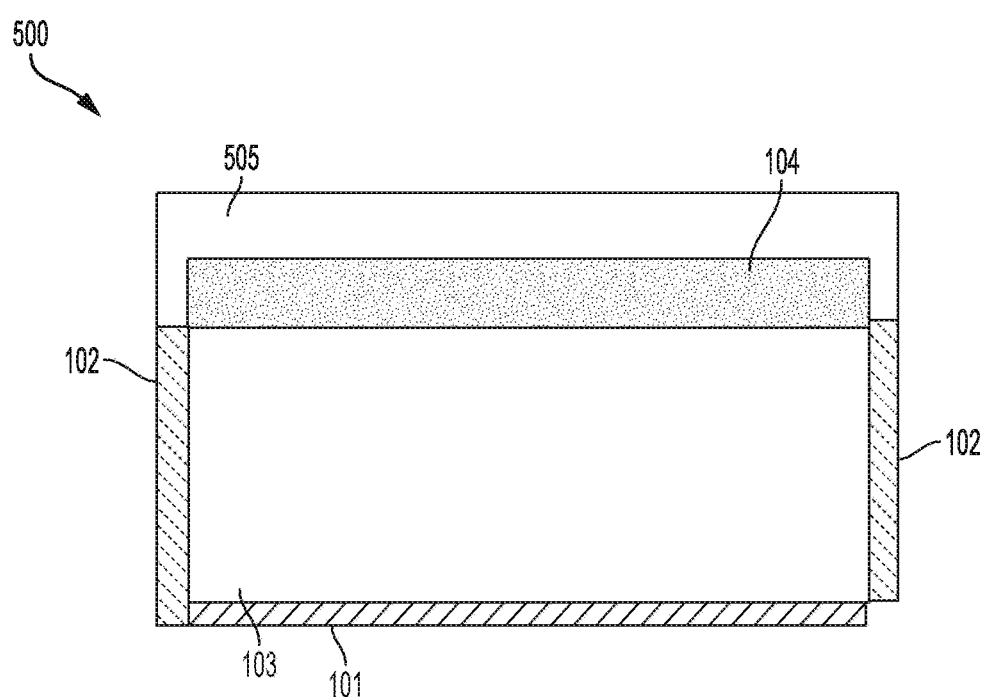
FIG. 5 shows a cross-sectional view of a fourth embodiment of the light source.

According to another embodiment in FIG. 5, protective layer 505 covers only quantum dot layer 104 rather than covering led ring 102. In this way, material costs can be reduced.

Following assembly as explained above, a light source is realized which can produce light at a specific wavelength through interaction between LED ring 102 and quantum dot layer 104.

Related to the above disclosure, a method of producing a light source is disclosed herein.

Figure 6B:
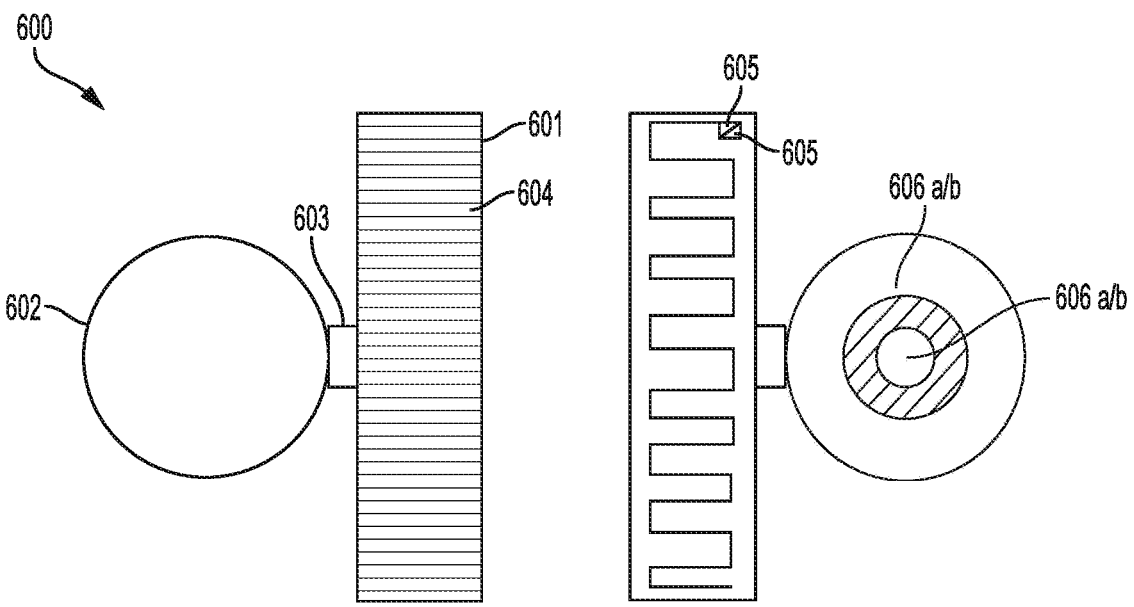
FIG. 6B shows a bottom side configuration of the structure illustrated in FIG. 6A1.
Figure 6B:
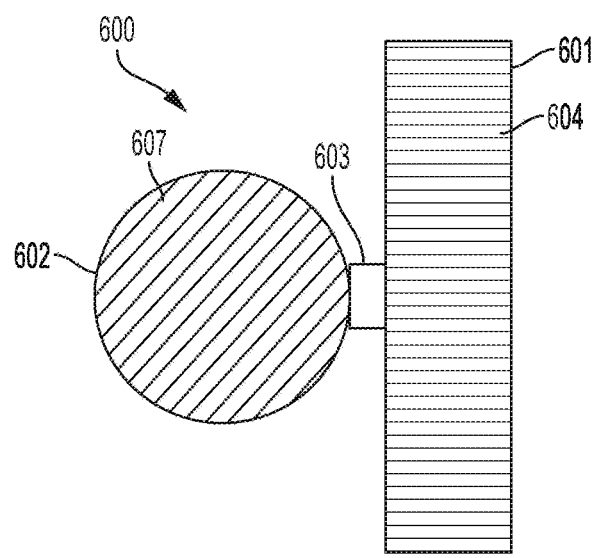

Various steps of fabrication are shown in FIGS. 6A-6H. FIG. 6A1 shows the top side of a cut piece of material which constitutes the structure of the various components of LED ring 102, connecting portion 107 and base portion 101. It is generally preferable to form this structure out of Mylar, but other materials may be use as is appropriate to a given embodiment. Mylar structure 600 is comprised of wall portion 601, base portion 602, and connecting portion 603. Other embodiments are configured such that wall portion 601 and base portion 602 are separate elements. Printed on wall portion 601 is LED grid 604, which is electrically connected to back-plane circuitry 605 shown in FIG. 6A2, which is Mylar structure 600 flipped along a vertical line (i.e. the bottom side of Mylar structure 600). In some embodiments, Mylar structure 600 features bottom-plane circuitry 606 instead of or in addition to back-plane circuitry 605. Back-plane circuitry 605 and bottom-plane circuitry 606 serve to power LED grid 604. As shown in FIG. 6B, after formation of Mylar structure 600 and its associated components, atomic layer deposition (ALD) or sputtering is performed on the top side of base portion 602 in order to deposit aluminum deposition 607 thereon. Aluminum deposition 607 provides a reflective backplane to base portion 102 which enhances the reflective properties of the light source. Additionally, in some embodiments the remainder of Mylar structure 600 has aluminum deposited thereon to increase reflectivity. In alternative embodiments, a coating forming a one-way mirror is formed on the top side of Mylar structure 600.

Figure 6C:
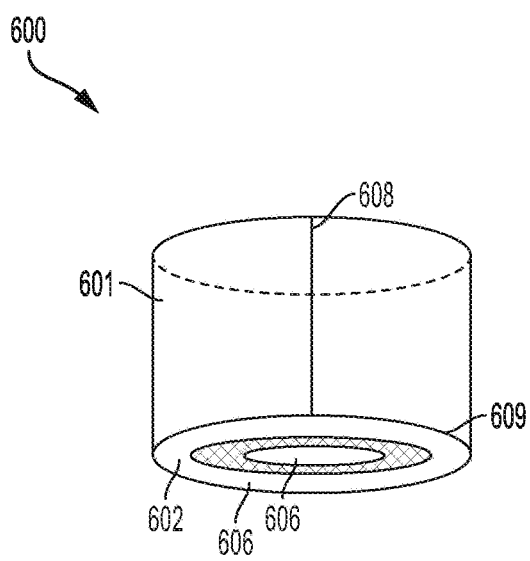
FIG. 6C shows a molding step in a fabrication process of the light source.

Following formation of aluminum deposition 607, Mylar structure 600 is inserted into a mold. Preferably, the mold is comprised of glass. In FIG. 6C, the shape of the folded Mylar structure 600 can be seen after insertion into the mold (the mold itself is omitted from the figures for brevity, but is generally cylindrical in configuration). As can be seen in FIG. 6C, base portion 602 is placed essentially perpendicular to wall portion 601. Connecting portion 603 is omitted from FIGS. 6C-6G for clarity, but serves as a bending point between wall portion 601 and base portion 602. Additionally, wall portion 601 is bent along the curvature of the mold such that it contacts itself along the short edges, thus forming vertical seam 608. Additionally, this bending forms circumferential seam 609 between wall portion 601 and base portion 602.

Figure 6D:
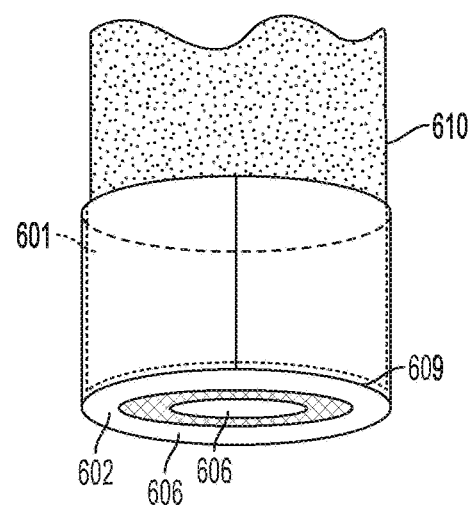
FIG. 6D shows a curing step in a fabrication process of the light source.

Once Mylar structure 600 is inserted into the mold as disclosed above, dowel 610 is inserted into the cavity formed by Mylar structure 600 within the mold, as is shown in FIG. 6D. Dowel 610 is made of Teflon, or alternatively glass, stainless steel, or borosilicate. Other materials may be utilized as are appropriate to different embodiments. Following insertion of dowel 610, temperature curing is performed to set the shape of Mylar structure 600. Temperature curing is, in some embodiments, performed for 90 minutes while ramping from 50 degrees centigrade to 120 degrees centigrade. Following temperature curing, dowel 610 is removed. In alternative embodiments, a pressure mold is used which employs negative pressure against the outward facing side of mylar structure 600 in order to hold its shape during temperature curing, thus obviating the need for dowel 610.

In certain embodiments, following removal of dowel 610, wall portion 601 and base portion 602 are joined to one another by way of plastic welding. Other joining techniques are used in further embodiments as is appropriate to the intended configuration of the light source.

Figure 6E:
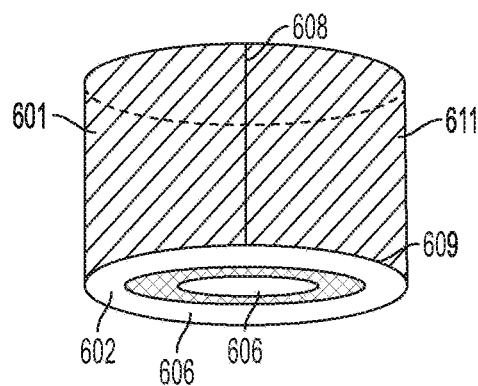
FIG. 6E shows a deposition step in a fabrication process of the light source.
Figure 6F:
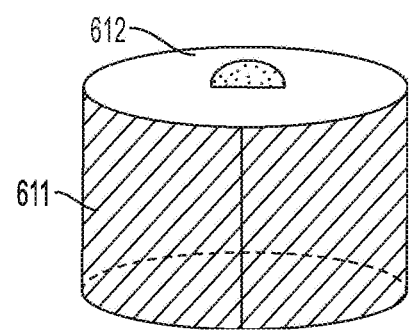
FIG. 6F shows a spin coating step in a fabrication process of the light source.

Following removal of dowel 610, PDMS insertion is performed on the resultant rigid cavity. As is shown in FIG. 6E, PDMS insertion results in the cavity formed by Mylar structure 600 being filled with PDMS, thereby forming optical cavity 611. In some embodiments, optical cavity 611 is impregnated with quantum dots. PDMS injection is performed using molten PDMS using conventional injection methods, as is appropriate to a given embodiment. Following PDMS insertion, the light source is placed in a desiccator in order to facilitate curing. In an embodiment, desiccation is performed for 30 minutes followed by an additional 90 minutes of heat curing at 50 degrees centigrade. Following desiccation and curing, the light source is removed from the mold.

Figure 6G:
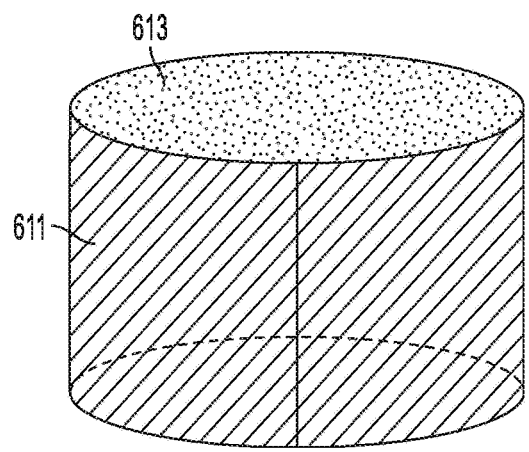
FIG. 6G shows a spin coating step in a fabrication process of the light source.
Figure 6H:
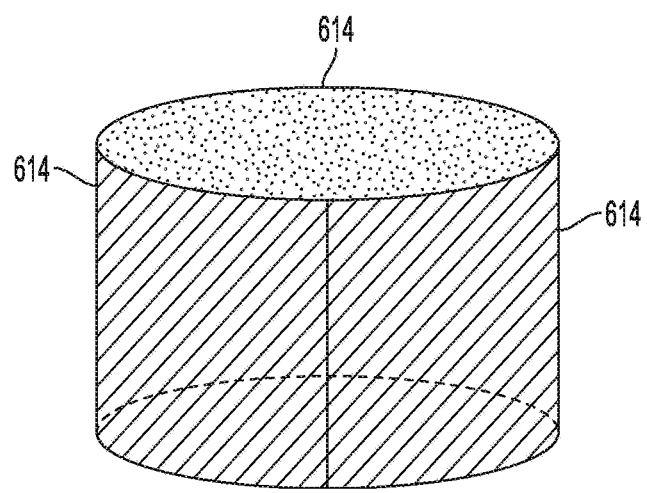
FIG. 6H shows a deposition step in a fabrication process of the light source.

Following formation of optical cavity 611 within Mylar structure 600, spin coating is performed to coat the top of optical cavity 611 with quantum dots. In some of the aforementioned embodiments in which optical cavity 611 is impregnated with quantum dots, this step is skipped. Quantum dots are coated on the surface of optical cavity 611 by first depositing quantum dot bubble 612 on top of optical cavity 611. In some embodiments, quantum dot bubble 612 is composed of quantum dots suspended in toluene, which facilitates an ideal density and dispersion of the quantum dots therein. Spin coating of the top of optical cavity 611 results in distribution of the quantum dots into quantum dot layer 613, as is shown in FIG. 6G.

Finally, in order to protect and fix the quantum dot layer 613, and to provide additional stability to the light source, the entirety of the light source, excluding the bottom of base portion 602, is coated in aluminum oxide layer 614 by way of atomic layer deposition. Thus, a light source (i.e. light source 100) is formed.

It will be appreciated that the foregoing description relates to a light source in which a wavelength of light is regulated by a layer of quantum dots. The layer of quantum dots 104 is arranged roughly perpendicular to the direction of light projection of the LEDs of LED ring 102. Therefore, photons emitted by the LEDs are unlikely to encounter quantum dot layer 104 at a right angle, but rather are likely to be reflected off of LED ring 102 and/or base portion 101 before encountering quantum dot layer 104 at an oblique angle. Because of this oblique angle of incidence, the layer of quantum dots may be relatively thin compared to a system in which photons encounter a quantum dot layer at a right angle. In such a system, a thicker layer of quantum dots would be necessary to ensure a wavelength shift is induced.

A light source capable of producing light at a specific wavelength at a low cost and complexity is thus realized. This light source has been described, above, in terms of a concrete implementation; the person familiar with this field will find other specific implementations to be achievable and well within the scope of the appended claims.

What is claimed is:

1. A method of manufacturing a light source, the method comprising:
    disposing a strip comprising a base portion and a wall portion in a mold, the wall portion and the base portion together constituting an integrated structure, the base portion being adjacent to the bottom of the mold, and the wall portion being adjacent to a side of the mold, the integrated structure thereby forming a well;
    curing the strip into a rigid form;
    forming an optical cavity that is filled in the well; and
    depositing a quantum dot layer above the well;
    wherein an inward-facing surface of the wall portion is provided with a plurality of LEDs configured to emit photons that encounter the quantum dot layer at an oblique angle of incidence, and
    wherein the base portion is free of the LEDs.

2. The method of manufacturing a light source according to claim 1, wherein curing the strip into the rigid form further comprises:
    inserting a dowel into the well;
    performing temperature curing while the dowel is inserted into the well; and
    removing the dowel from the well.

3. The method of manufacturing a light source according to claim 2, wherein the forming of the optical cavity comprises:
    depositing an amount of a material for forming an optical cavity into the well formed by the integrated structure;
    curing the material, thereby forming the optical cavity; and
    removing the light source from the mold.

4. The method of claim 3, wherein the material is composed of polydimethylsiloxane (PDMS).

5. The method of claim 2, wherein depositing the quantum dot layer comprises spin coating, the spin coating comprising:
    depositing a quantum dot bubble on a top surface of the optical cavity; and
    spinning the light source to distribute the quantum dot bubble.

6. The method of manufacturing a light source according to claim 2, wherein the method further comprises disposing a protective layer over the quantum dot layer.

7. The method of claim 6, wherein the protective layer is formed of Aluminum Oxide (A10) deposited by atomic layer deposition.

8. The method of claim 2, wherein electrical contacts are disposed on a bottom surface of the base portion.

9. The method of claim 2, wherein electrical contacts are disposed on an outside surface of the wall portion.

10. The method of claim 2, wherein depositing the quantum dot layer comprises sputtering quantum dots onto the optical cavity.

11. The method of claim 2, wherein the inward-facing surface of the wall portion and the base portion are optically reflective.

* * * * *